United States Patent [19]

Omata

[11] Patent Number: 5,218,660

[45] Date of Patent: Jun. 8, 1993

[54] ILLUMINATION DEVICE

[75] Inventor: Takashi Omata, Yokosuka, Japan

[73] Assignee: Canon Kabushiki Kaisha, Tokyo, Japan

[21] Appl. No.: 830,448

[22] Filed: Feb. 5, 1992

Related U.S. Application Data

[63] Continuation of Ser. No. 758,306, Aug. 28, 1991, abandoned, which is a continuation of Ser. No. 618,418, Nov. 27, 1990, abandoned.

[30] Foreign Application Priority Data

Nov. 29, 1989 [JP] Japan ................................ 1-310256

[51] Int. Cl.$^5$ .......................... G02B 6/06; G02B 6/04
[52] U.S. Cl. .................................................. 385/116
[58] Field of Search ............... 350/96.10, 96.20, 96.18; 385/116, 120, 121

[56] References Cited

U.S. PATENT DOCUMENTS

| | | | |
|---|---|---|---|
| 4,682,885 | 7/1987 | Torigoe | 355/67 |
| 4,683,524 | 7/1987 | Ohta | 385/116 |
| 4,734,829 | 3/1988 | Wu et al. | 385/116 |
| 4,952,022 | 8/1990 | Genovese | 385/116 |

FOREIGN PATENT DOCUMENTS

62-115718  5/1987  Japan.
62-115719  5/1987  Japan.

Primary Examiner—John D. Lee
Assistant Examiner—Robert E. Wise
Attorney, Agent, or Firm—Fitzpatrick, Cella, Harper & Scinto

[57] ABSTRACT

An illumination device for illuminating a surface with a radiation beam of arcuate cross-section is disclosed. The device includes a radiation source for producing a radiation beam having a uniform intensity; an optical system including a stop with an arcuate opening to be irradiated with the radiation beam from the source, an image of the arcuate opening irradiated being projected on the surface for illumination of the same; and a light pipe assembly for directing the radiation beam from the source to the optical system while maintaining a substantially constant angle of opening of the same, the light pipe assembly including a plurality of subassemblies each having an array of light pipes of polygonal cross-section; wherein those light pipes in the subassemblies close to the source are combined to define an entrance surface of the light pipe assembly while those light pipes of the subassemblies close to the optical system are so disposed that their exit surfaces are arrayed along an arcuate line similar to the shape of the opening of the stop; and wherein the light pipe assembly is adapted to receive the radiation beam from the source to divide the received radiation beam into portions for the subassemblies, respectively; whereby the light portions emanating from the exit surfaces of the subassemblies illuminate the surface to be illuminated.

30 Claims, 4 Drawing Sheets

ILLUMINATION DEVICE

This application is a continuation of prior application, Ser. No. 07/758,306 filed Aug. 28, 1991, which application is a continuation of prior application, Ser. No. 07/618,418 filed Nov. 27, 1990, both now abandoned.

FIELD OF THE INVENTION AND RELATED ART

This invention relates to an illumination device and, more particularly, to an illumination device suitably usable as an optical arrangement in a semiconductor device manufacturing exposure apparatus, for example, for illuminating a mask having a circuit pattern.

In a known example of such an exposure apparatus, a mask is illuminated by projecting on the mask an image of an arcuate opening, and the circuit pattern of the illuminated mask is projected onto a semiconductor wafer by a mirror projection system comprising an assembly of positive- and negative-power mirrors, by which the circuit pattern is transferred to a resist of the wafer.

In this type of illumination optical system, for illumination of the mask, a stop having an arcuate opening is illuminated with light from a lamp and the image of the thus illuminated opening is projected onto the mask. This leads to a result that the throughput of the exposure apparatus is dependent upon the quantity of light which irradiates the arcuate opening of the stop.

Figure 1:
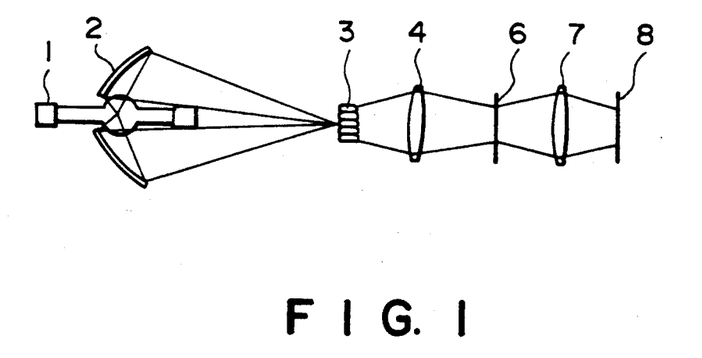
FIG. 1 is a schematic view of a known type illumination optical system.

U.S. Pat. No. 4,682,885 assigned to the same assignee of the subject application proposes an improved illumination optical system by which a large quantity of light can be directed to an arcuate opening of a stop. FIG. 1 illustrates the general structure of this illumination optical system.

In FIG. 1, light from a lamp 1 is collected by an elliptical mirror 2 on a light input plane of an optical integrator 3. The integrator 3 serves to divide the received light into a plurality of light fluxes which are emitted toward a condenser lens 4. The lens 4 serves to direct these light fluxes to a stop 6 having an arcuate opening and to superpose them one upon another on the surface of the stop 6. The portion of the stop illuminating light which passes through the arcuate opening of the stop 6 is focused by a lens 7 on a mask 8. Here, the lens 7 serves to project an image of the arcuate opening of the stop 6 upon the mask 8. In this illumination optical system, the integrator 3 has a lens function similar to that of a toric lens, by which the arcuate opening of the stop 6 can be illuminated effectively.

Japanese Laid-Open Patent Applications, Laid-Open Nos. Sho 62-115718 and Sho 62-115719, filed in Japan under the name of the assignee of the subject application, propose an improved illumination optical system of the type that an image of an arcuate opening is projected.

The latter, Japanese Laid-Open Patent Application, Laid-Open No. Sho 62-115719, shows an illumination optical system wherein light from a lamp is inputted to an optical device such as an optical integrator or a single light pipe, effective to make the light intensity distribution uniform, and the light emanating from such an optical device is inputted to a bundle of optical fibers, through a collimator lens when an optical integrator is used. The optical fibers of the fiber bundle are fastened to provide a circular cross-section at the light entrance side and to provide an arcuate cross-section at the light exit side. Thus, the light inputted to the fiber bundle is transformed into light of arcuate cross-sectional shape which in turn illuminates a stop having an arcuate opening.

This illumination optical system is effective to define a brighter image of the arcuate opening, but since an optical fiber bundle has a relatively low packing efficiency, there is not a small loss of light quantity as the optical fiber bundle receives the light.

The former, Japanese Laid-Open Patent Application, Laid-Open No. Sho 62-115718, shows an illumination optical system wherein light from a lamp is inputted to a bundle of light pipes. The light pipe bundle has a rectangular cross-section at the light entrance side and an approximately arcuate cross-section at the light exit side. The output light having an arcuate cross-sectional shape defined by the light pipe bundle is directed by a lens to an optical integrator which comprises light pipes of arcuate cross-sectional shape, arrayed and adhered together. The integrator produces a number of light fluxes which are superposed one upon another on the surface of a stop having an arcuate opening. Thus, the stop can be illuminated with light of an arcuate cross-section, having a uniform light intensity.

This illumination optical system can produce a brighter image of the arcuate opening. However, the structure of the optical integrator is somewhat complicated. Further, some light pipes of the light pipe bundle have to be bent or twisted, and the fabrication of the light pipe bundle is not very easy.

SUMMARY OF THE INVENTION

It is accordingly a primary object of the present invention to provide an improved illumination device having an enhanced light efficiency.

In accordance with an aspect of the present invention, to achieve this object, the illumination device is equipped with beam producing means for producing a radiation beam having a uniform intensity; an optical system including a stop with an arcuate opening to be irradiated with the radiation beam from said beam producing means, an image of said arcuate opening as irradiated being projected on the surface for illumination of the same; and a light pipe assembly for directing the radiation beam from said beam producing means to said optical system while maintaining a substantially constant angle of opening of the same, said light pipe assembly including a plurality of subassemblies each having an array of light pipes of polygonal cross-section; wherein those light pipes in said subassemblies close to said beam producing means are combined to define an entrance surface of said light pipe assembly while those light pipes of said subassemblies close to said optical system are so disposed that their exit surfaces are arrayed along an arcuate line similar to the shape of said opening of said stop; and wherein said light pipe assembly is adapted to receive the radiation beam from said beam producing means to divide the received radiation beam into portions for said subassemblies, respectively; whereby the light portions emanating from the exit surfaces of said subassemblies illuminate the surface to be illuminated.

The beam producing means may include a light source such as a lamp or a laser, and an optical device such as an optical integrator or a light pipe. Light from the light source may be collected by a lens or an elliptical mirror onto the optical device. Multiple beams from the optical integrator may be superposed one upon another by means of a lens or the like, or alternatively, light rays inputted to the light pipe may be mixed therewithin, by which a radiation beam of uniform intensity may be produced.

The optical system may have two different structures, one of which is that a stop is disposed close to the beam producing means and the other of which is that a stop is not disposed so. In the latter case, a lens may be disposed at that position "close to the beam producing means" and this lens may serve to image on the stop the arcuate cross-sectional beam provided by the light pipe assembly.

The illumination device of the present invention can be incorporated into an exposure apparatus for the manufacture of semiconductor devices or liquid crystal panel display devices, with a large advantageous effect. This is because, with the illumination device of the present invention, a very bright image of the arcuate opening can be formed and projected on a mask, which effectively assures a large increase in the throughput of the devices manufactured by the exposure apparatus. Further, in the illumination device of the present invention, the light pipe assembly can relay the radiation beam to a downstream optical system while preserving the angle of opening of the radiation beam as determined by the beam producing means. Therefore, the numerical aperture (NA) can be easily set as desired by modifying the arrangement of the beam producing means.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENT

Figure 2:
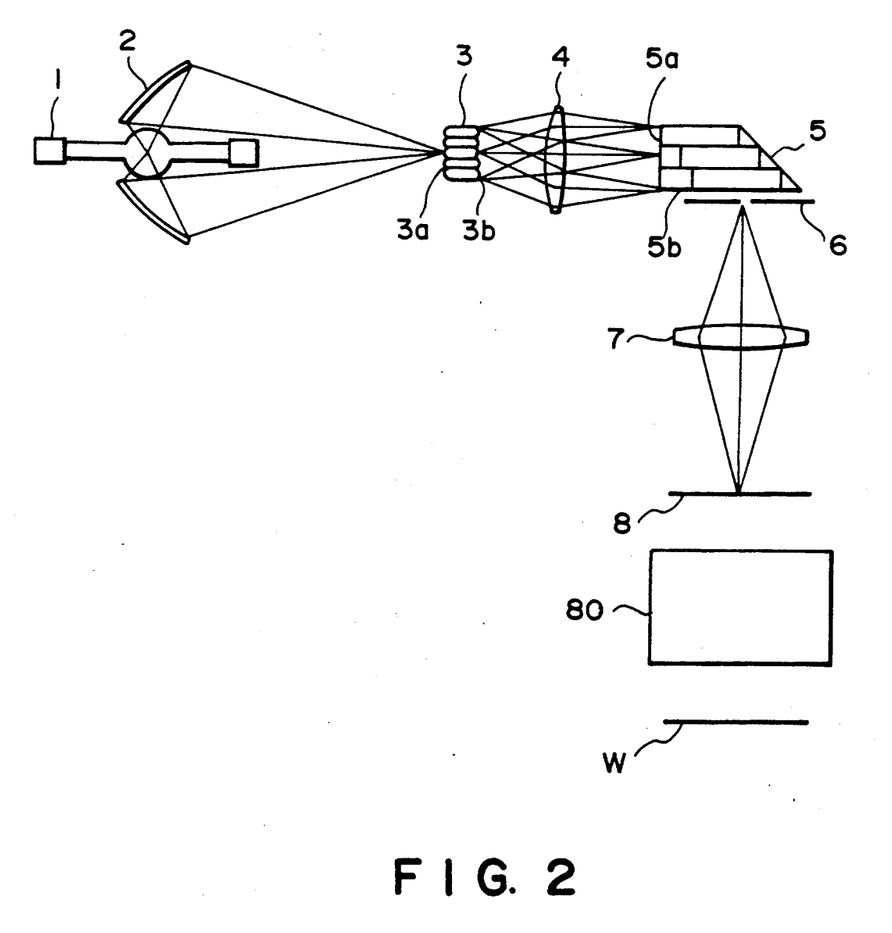
FIG. 2 is a schematic view of a major portion of an illumination device according to a first embodiment of the present invention.
Figure 3:
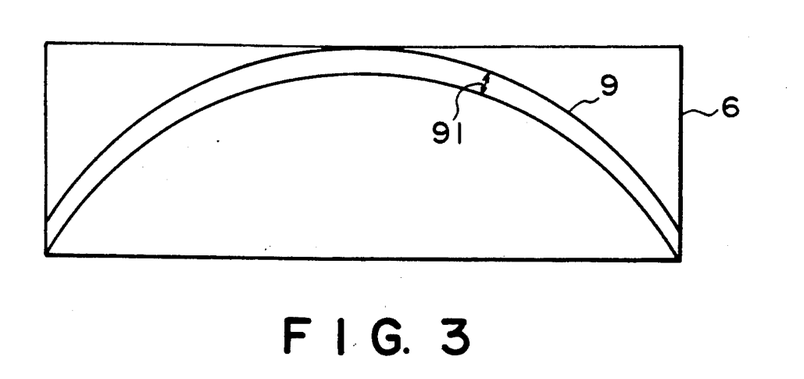
FIG. 3 is an enlarged view of a slit plate used in the FIG. 2 embodiment.

Referring to FIG. 2 showing a major portion of an illumination device according to a first embodiment of the present invention reference numeral 1 denotes a light source for illumination which comprises an ultra high Hg lamp. Denoted at 2 is an elliptical mirror, and the light emitting portion of the light source 1 is disposed at the first focal point of the mirror 2. Light integrator 3 comprises a fly's eye lens system having a plurality of arrayed bar lenses. The integrator 3 has its light entrance plane 3a disposed at the second focal plane of the elliptical mirror 2. Light collecting system 4 comprises a collimator lens, in this embodiment, and the light exit plane of the integrator 3 is disposed at the front focal plane of the collimator lens. Disposed at the rear focal plane of the collimator lens 4 is a light pipe assembly 5 having a light entrance surface 5a of a generally rectangular shape and a light exit surface of a generally discontinuous or non-smooth arcuate shape, to be described later. The light pipe assembly serves to transform the light from the lens 4 into light of approximately arcuate cross-sectional shape and to emit the same. Slit plate 6 serves as a field stop and has an arcuate opening 9 as shown in FIG. 3. Imaging lens 7 functions to direct the light, emanating from the arcuate opening 9 of the slit plate 6, toward the surface of a photomask 8 which is the surface to be illuminated. More specifically, the imaging lens 7 serves to project an image of the opening 9 upon the photomask 8 surface.

Diagrammatically illustrated by reference numeral 80 is a mirror projection system comprising convex and concave mirrors and having a best imaging region which is of an arcuate shape. The mirror projection system 80 serves to project an image of a circuit pattern of the photomask 8 onto a wafer W, whereby the circuit pattern can be transferred to a resist on the wafer W.

In this embodiment, the light from the light source 1 is reflectively collected by the elliptical mirror 2, efficiently, to the light entrance plane 3a of the light integrator 3. Then, the integrator 3 defines on its light exit plane 3b a plurality of secondary light sources. The light beams from these secondary light sources on the light exit plane 3b are each transformed by the lens 4 into a parallel beam and, by the function of the same lens, they are superposed one upon another on the light entrance surface 5a of the light pipe assembly 5. Thus, the light entrance surface of the light pipe assembly can receive light having a uniform sectional light intensity distribution. Here, as understood, the light entrance surface 5a of the light pipe assembly 5 is illuminated in what is called a "Kohler illumination" manner, with the multiple beams from the integrator.

The light emanating from the light exit surface 5b of the light pipe assembly 5, having a generally arcuate cross-sectional shape and having a uniform light intensity, illuminates the arcuate opening 9 of the slit plate 6 uniformly. Then, the light passing through the arcuate opening 9 is projected by the imaging lens 7 to illuminate the mask 8 surface with an arcuate light image having a uniform intensity.

Next, the structure of the light pipe assembly 5 of the present embodiment will be explained in detail.

Figure 4:
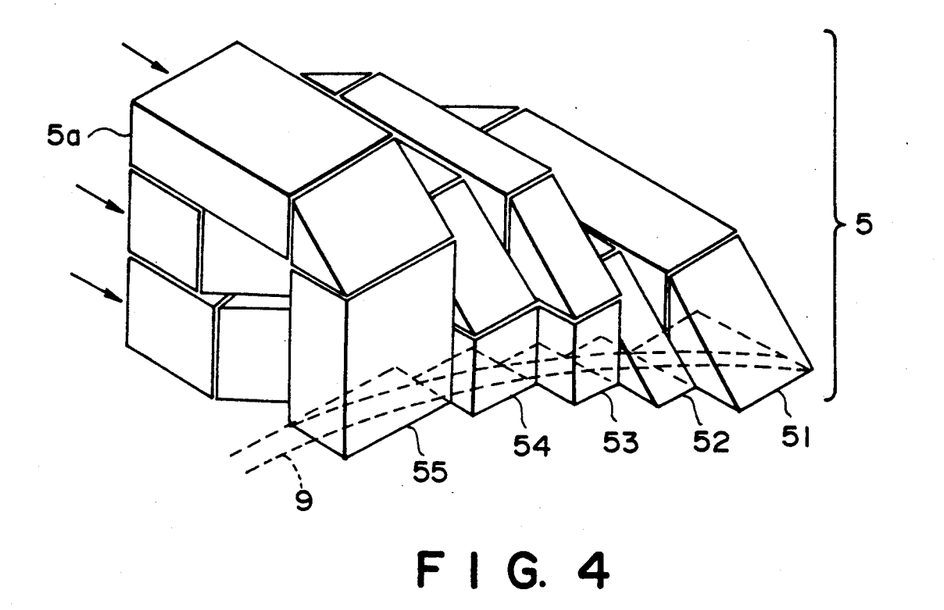
FIG. 4 is a perspective view of a light pipe assembly of the FIG. 2 embodiment.

Referring to FIG. 4 which is a perspective view of the light pipe assembly 5, in this embodiment, the light pipe assembly 5 comprises a plurality of subassemblies 51, 52, 53, 54 and 55.

Figure 5:
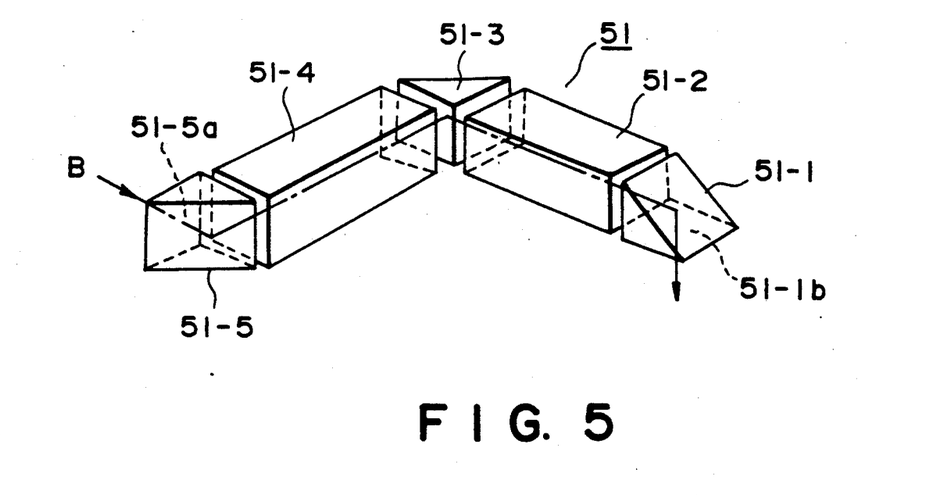
FIG. 5 is a perspective view of one subassembly of the light pipe assembly.

As regards the subassembly 51, for example, as best seen in FIG. 5, it includes a plurality of light pipes 51-2 and 51-4 each being provided by a straight rigid member with internal reflection, made by a glass block having a rectangular parallelepiped shape or a hollow rodlike element having a polygonal cross-section, for example. In this example, each light pipe is provided by a glass block of rectangular parallelepiped shape. Also, each light pipe has light transmission surfaces of polygonal shape (rectangular in the illustrated example) having the same area. These light pipes are joined optically. Reference numerals 51-1, 51-3 and 51-5 denote triangle-pole glass blocks, each serving as a triangle prism having a slant surface that functions as a reflection surface.

In this example, the light entering into the light pipe 51-5 from the light entrance end 51-5a thereof goes through the light pipes 51-4 to 51-1 while being internally reflected by the inside surfaces of them, and it reaches the light exit end 51-1b. Here, if the angle of incidence of the input light (B) is limited in a certain range, within each light pipe the input light (B) can be totally reflected by the inside surfaces of the light pipe. Thus, there occurs substantially no loss of light quantity as a result of the reflection. When the material of the prism constituting the light pipe has a low refractive index, there is a possibility that the reflection at the inside surface is not the total reflection. On that occasion, the inside surface of the light pipe may preferably be coated with a suitable reflection film. Further, if the outside surface of each light pipe facing to a light pipe of another subassembly intimately contacts the outside surface of that light pipe, there possibly occurs leakage of light. In consideration thereof, a clearance may preferably be provided between the surfaces of these light pipes or, alternatively, the outside surfaces may preferably be coated with a material having a low refractive index as compared with that of the material of the light pipe, so as to ensure total reflection.

Figures 6, 7:
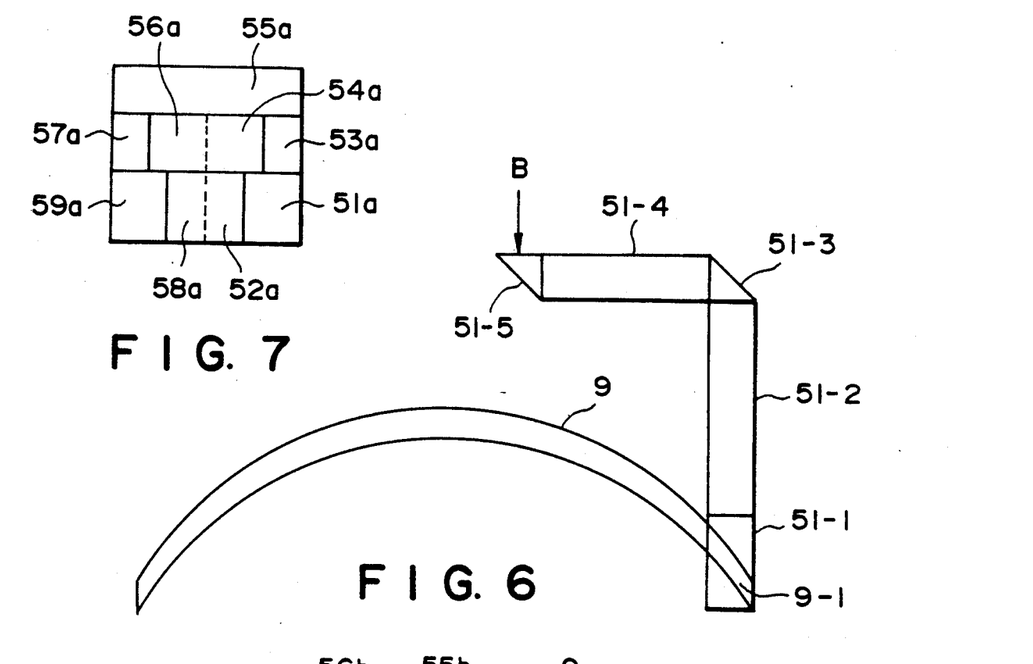
FIG. 6 is a schematic view, illustrating the relationship between the one subassembly of FIG. 4 and the illumination zone.
FIGS. 7 and 8 are schematic views, respectively, illustrating the light entrance surface and the light exit surfaces of a light pipe assembly, respectively, according to the present invention.

The light emanating from the subassembly 51 illuminates, as shown in FIG. 6, a portion 9-1 of the arcuate opening 9 of the slit plate 6.

In a similar manner, the subassemblies 51, 52, 53 and so on define respective optical waveguides, and they are disposed close to each other as illustrated.

Figure 8:
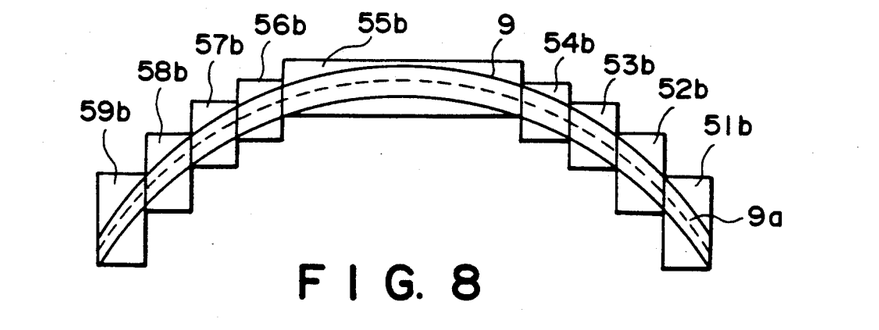

By combining these light pipe subassemblies 51, 52, 53 and so on, the light pipe assembly 5 is provided. Here, as a whole, the light pipe assembly 5 ha its light entrance surface 5a formed with a generally square shape as shown in FIG. 7, wherein each of the light entrance surfaces 51a, 52a, 53a and so on of the subassemblies 51, 52, 53 and so on has a polygonal shape (rectangular shape in the illustrated example). On the other hand, as best seen in FIG. 8, the light exit surface 5b has a discontinuous but generally arcuate shape, wherein the light exit surfaces 51b, 52b, 53b and so on of the subassemblies 51, 52, 53 and so on are arrayed along an arcuate line, so as to be aligned with corresponding portions of the arcuate zone 9a of the opening 9. With the above-described arrangement, enhanced efficiency in the use of light is ensured.

Optical characteristics of the light pipe of the present embodiment will now be explained.

Figure 9:
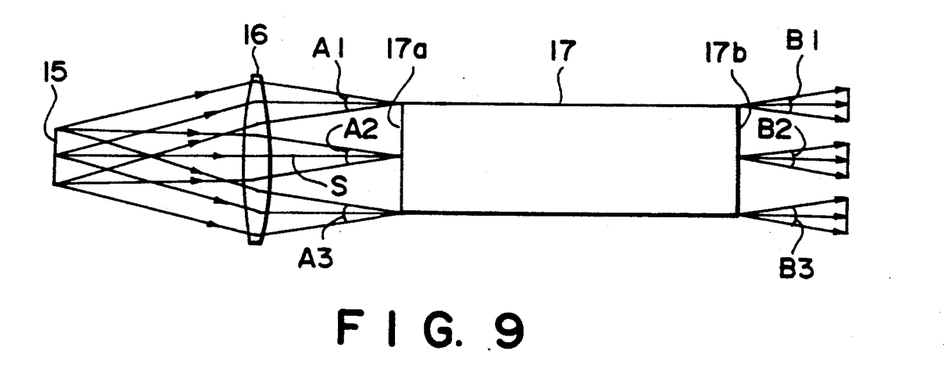
FIG. 9 is a schematic view, illustrating the optical characteristics of each subassembly of a light pipe assembly of the present invention.

It is now assumed that as shown in FIG. 9 a light entrance end 17a of a light pipe 17 having a rectangular parallelepiped shape is illuminated in the Kohler illumination manner with the light from a light source 15 and through a lens 16, wherein the light source is at a position corresponding to the light exit plane 3b of the light integrator 3 (FIG. 2). On this occasion, if the angle of a cone (angle of opening) at A1, the angle of a cone at A2, the angle of a cone at A3 and so on of the input light fluxes at respective points on the light entrance surface 17a of the light pipe are equal to each other and if the luminous intensity distribution in the cone is symmetrical with respect to an axis S, then the angle of a cone (angle of opening) at B1, the angle of a cone at B2, the angle of a cone at B3 and so on of the output light fluxes at respective points on the light exit surface 17b of the light pipe 17 become equal to each other. Thus, the luminous intensity distribution characteristic can be preserved. Since the angle of an optical con and the luminous intensity distribution in the cone, of the light that illuminates the mask surface (the surface to be illuminated) 8, have a large affect upon the imaging performance of the imaging lens 7 or the mirror projection system 80, the above-described feature of the light pipe is very advantageous in fabrication of an illumination optical system, in that it ensures good imaging performance of the imaging lens 7 or the mirror projection system 80 throughout the whole illumination zone.

The light pipe as described earlier is provided by a combination of triangle-pole glass blocks (prisms) and rectangular parallelepiped glass blocks, and this light pipe also has the same feature as having been explained with reference to FIG. 9. Thus, it is contributable to provide a correct angle of optical cone and a correct luminous intensity distribution, for the mask illumination, throughout the whole illumination zone.

Figure 10:
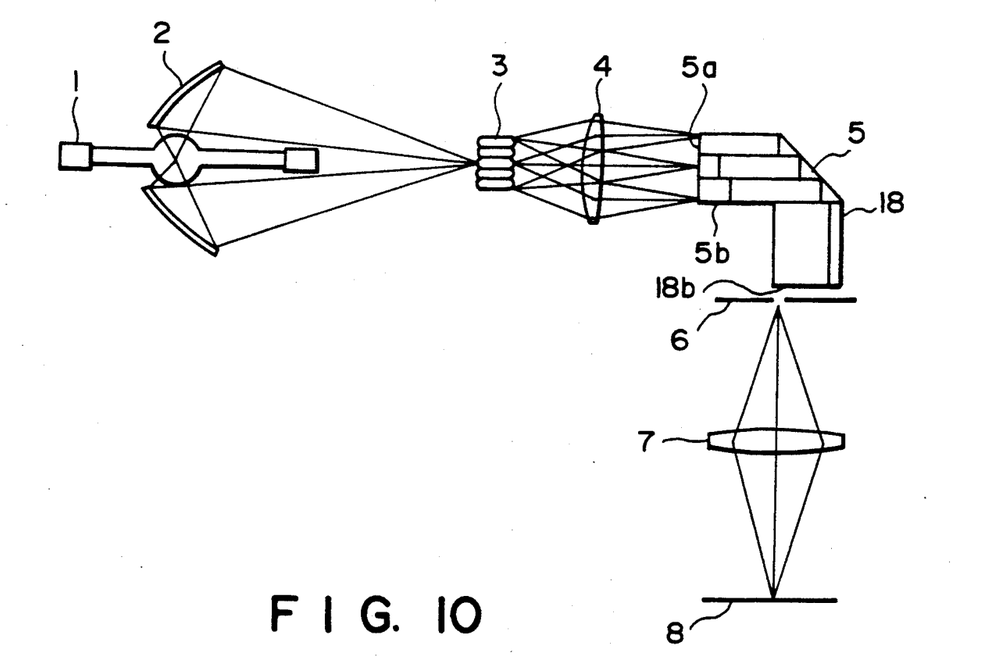
FIG. 10 is a schematic view of a major portion of an illumination device according to a second embodiment of the present invention.

FIG. 10 is a schematic view of a major portion of an illumination device according to a second embodiment of the present invention.

Figure 11:
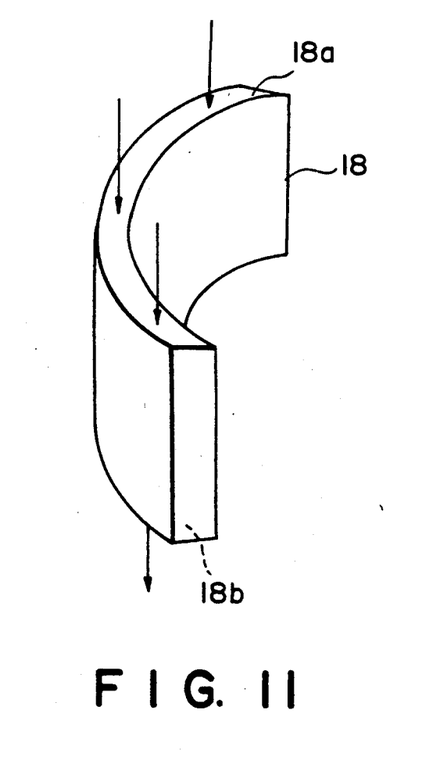
FIG. 11 is a perspective view showing a light of an arcuate cross-section, of the FIG. 10 embodiment.

In this embodiment, as compared with the FIG. 2 embodiment, an additional light pipe 18 such as shown in FIG. 11 having an arcuate cross-sectional shape, is disposed between the light pipe assembly 5 and the slit plate 6. The remaining portion of this embodiment has substantially the same structure as that of the FIG. 2 embodiment.

The arcuate shape light pipe 18 has a light entrance surface 18a and a light exit surface 18b each having an arcuate shape. Each of the light entrance and exit surfaces has a sufficient size to cover the arcuate opening 9 of the slit plate 6.

In this embodiment, light having an arcuate cross-sectional shape and emanating from the light exit surface 5b of the light pipe assembly 5, enters into the light pipe 18 and, after repeated internal reflection within the light pipe 18, the light goes out of the light exit surface 18b and illuminates the arcuate opening 9 of the slit plate 6 which is disposed just after the light exit surface 18b.

Actually, because of an error during the manufacture of the light pipe or the like, there is a possibility of small non-uniformness in illuminance on the light exit surface of the light pipe assembly 5. If an additional arcuate light pipe such as light pipe 18 is used as in the present embodiment, it is possible to avoid such non-uniformness in illuminance with substantially no loss of light quantity.

While in the embodiment of FIG. 2 or 10, an optical integrator such as designated by reference numeral 3 and a lens such as designated by reference numeral 4 are used for transformation of the light from a light source into light of uniform light intensity distribution, in place of using them a square pole pipe may be used so as to mix the light rays from the lamp within the pipe to thereby produce light of uniform intensity distribution. Also, the light source is not limited to a lamp, and a laser may be used as an example.

Further, a lens may be disposed between the light pipe assembly 5 and the slit plate 6 so as to place them in an optically conjugate relation with each other, such that light of arcuate cross-sectional shape as formed by the assembly 5 may be imaged on the slit plate 6.

While the invention has been described with reference to the structures disclosed herein, it is not confined to the details set forth and this application is intended to cover such modifications or changes as may come within the purposes of the improvements or the scope of the following claims.

What is claimed is:

1. An illumination device for illuminating a surface with a radiation beam of arcuate cross section, said device comprising:

beam producing means for producing a radiation beam having a uniform intensity;

an optical system comprising a stop having an arcuate opening to be irradiated with the radiation beam from said beam producing means, an image of the arcuate opening as irradiated being projected on the surface for illumination of the same; and a light pipe assembly for directing the radiation beam from said beam producing means to said optical system while maintaining a substantially constant angle of opening of the same, said light pipe assembly comprising a plurality of subassemblies each having an array of light pipes of polygonal cross section;

wherein those light pipes in said subassemblies close to said beam producing means are combined to define an entrance surface of said light pipe assembly while those light pipes of said subassemblies close to said optical system are so disposed that their exit surfaces are arrayed along an arcuate line similar to the shape of the opening of said stop; and wherein said light pipe assembly is adapted to receive the radiation beam from said beam producing means to divide the received radiation beam into portions for said subassemblies, respectively, whereby the light portions emanating from the exit surfaces of said subassemblies illuminate the arcuate opening of said stop.

2. A device according to claim 1, wherein the entrance surface of said light pipe assembly has a rectangular shape.

3. A device according to claim 1, wherein said beam producing means comprises a radiation source, an optical integrator, a first collecting system for directing optical energy from said radiation source to said optical integrator to cause said optical integrator to produce a plurality of radiation beams, and a second collecting system for projecting the plurality of radiation beams from said optical integrator to the entrance surface of said light pipe assembly and for superposing them one upon another on the entrance surface of said light pipe assembly.

4. A device according to claim 1, wherein said light pipe assembly comprises an auxiliary light pipe having a shape similar to that of the opening, and wherein said auxiliary light pipe serves to direct the respective portions of light from said subassemblies to the opening.

5. An exposure apparatus, comprising:

beam producing means for producing a radiation beam having a uniform intensity;

an optical system comprising a stop having an arcuate opening to be irradiated with the radiation beam from said beam producing means, an image of the arcuate opening as irradiated being projected on a mask for illumination of the same;

a mirror assembly for projecting on a wafer an image of a circuit pattern of the mask illuminated with the image of the opening of said stop; and a light pipe assembly for directing the radiation beam from said beam producing means to said optical system while maintaining a substantially constant angle of opening of the same, said light pipe assembly comprising a plurality of subassemblies each having an array of light pipes of polygonal cross section;

wherein those light pipes in said subassemblies close to said beam producing means are combined to define an entrance surface of said light pipe assembly while those light pipes of said subassemblies close to said optical system are so disposed that their exit surfaces are arrayed along an arcuate line similar to the shape of the opening of said stop; and wherein said light pipe assembly is adapted to receive the radiation beam from said beam producing means to divide the received radiation beam into portions for said subassemblies, respectively, whereby the light portions emanating from the exit surfaces of said subassemblies illuminate the arcuate opening of said stop.

6. An apparatus according to claim 5, wherein the entrance surface of said light pipe assembly has a rectangular shape.

7. An apparatus according to claim 5, wherein said beam producing means comprises a radiation source, an optical integrator, a first collecting system for directing optical energy from said radiation source to said optical integrator to cause said optical integrator to produce a plurality of radiation beams, and a second collecting system for projecting the plurality of radiation beams from said optical integrator to the entrance surface of said light pipe assembly and for superposing them one upon another on the entrance surface of said light pipe assembly.

8. An apparatus according to claim 5, wherein said light pipe assembly comprises an auxiliary light pipe having a shape similar to that of the opening, and wherein said auxiliary light pipe directs the respective portions of light from said subassemblies to the opening.

9. A device according to claim 8, wherein said optical system comprises an elliptical mirror for reflecting the light from said light source and light pipe means for directing the reflected light to said light pipe assembly.

10. An illumination device, comprising:

a light source for generating light;

a first optical system for receiving light from said light source and for providing light having a substantially uniform intensity distribution;

a light pipe assembly for receiving the light from said first optical system and for transforming the received light into light of a substantially arcuate shape, said light pipe assembly comprising a plurality of subassemblies each comprising a plurality of light pipes having a polygonal cross-sectional shape said subassemblies being disposed such that light reception surfaces thereof are arranged close to one another and such that light emission surfaces thereof are arranged along a predetermined arc, each of said subassemblies being adapted to transmit a corresponding portion of the light from said first optical system; and a second optical system comprising a stop having an arcuate opening to be illuminated with the arcuate light from said light pipe assembly, and an imaging optical system for imaging the arcuate opening of said stop, when illuminated, on a surface to be illuminated.

11. A device according to claim 10, wherein said first optical system comprises an elliptical mirror for reflecting the light from said light source, a lens array for receiving the reflected light from said elliptical mirror and for forming a plurality of secondary light sources, and a light collecting optical system for directing light beams from said secondary light sources so that they are superposed one upon another on said light pipe assembly.

12. A device according to claim 10, wherein said second optical system comprises imaging means for imaging the arcuate light from said light pipe assembly upon said stop.

13. A device according to claim 10, wherein said light pipe assembly comprises an auxiliary light pipe having an arcuate cross-sectional shape and a light reception surface disposed adjacent to the light emission surfaces of said subassemblies which are disposed substantially along the predetermined arc.

14. An exposure apparatus for projecting an image of a pattern of a mask onto a wafer for exposure of the wafer to the pattern of the mask, said apparatus comprising:
   a light source for generating light;
   a first optical system for receiving light from said light source and for providing light having a substantially uniform intensity distribution;
   a light pipe assembly for receiving the light from said first optical system and for transforming the received light into light of a substantially arcuate shape, said light pipe assembly comprising a plurality of subassemblies each comprising a plurality of light pipes having a polygonal cross-sectional shape, said subassemblies being disposed such that light reception surfaces thereof are placed close to one another and such that light emission surfaces thereof are placed along a predetermined arc, each of said subassemblies being adapted to transmit a corresponding portion of the light from said first optical system;
   a second optical system comprising a stop having an arcuate opening to be illuminated with arcuate light from said light pie assembly, and an imaging optical system for imaging the arcuate opening of said stop, when illuminated, on the mask, whereby the mask is illuminated with the light from the opening of said stop when the opening is illuminated; and
   a projection optical system for projecting the image of the pattern of the illuminated mask upon the wafer.

15. An apparatus according to claim 14, wherein said first optical system comprises an elliptical mirror for reflecting the light from said light source and light pipe means for directing the reflected light to said light pipe assembly.

16. An apparatus according to claim 14, wherein said first optical system comprises an elliptical mirror for reflecting the light from said light source, a lens array for receiving the reflected light from said elliptical mirror and for forming a plurality of secondary light sources, and a light collecting optical system for directing light beams from said secondary light sources so that they are superposed one upon another on said light pipe assembly.

17. An apparatus according to claim 14, wherein said second optical system comprises imaging means for imaging the arcuate light from said light pipe assembly upon said stop.

18. An apparatus according to claim 14, wherein said light pipe assembly comprises an auxiliary light pipe having an arcuate cross-sectional shape and a light reception surface disposed adjacent to the light emission surfaces of said subassemblies which are disposed substantially along the predetermined arc.

19. An illumination method comprising the steps of:
   providing light having a substantially uniform intensity distribution;
   passing portions of the light through light pipe assemblies having light reception surfaces disposed close to one another and light emission surfaces disposed along a predetermined arc, each of the light pipe assemblies having a polygonal cross-sectional shape, to produce light having a substantially arcuate shape; and
   directing the arcuate light to a surface to be illuminated.

20. A method according to claim 19, wherein said light providing step comprises directing light from a light source to light pipe means.

21. A method according to claim 19, wherein said light providing step comprises (i) projecting light from a light source to a lens array to divide the light into a plurality of light beams, and (ii) mixing the plurality of light beams.

22. A method according to claim 19, wherein said light directing step comprises (i) projecting the arcuate light to a stop having an arcuate opening, and (ii) projecting an image of the arcuate opening to the surface to be illuminated.

23. An exposure method for exposing a wafer to a pattern of a mask, said method comprising the steps of:
   providing light having a substantially uniform intensity distribution;
   passing portions of the light through light pipe assemblies having light reception surfaces disposed close to one another and light emission surfaces disposed along a predetermined arc, each of the light pipe assemblies having a polygonal cross-sectional shape, to produce light having a substantially arcuate shape; and
   projecting the arcuate light to the pattern of the mask and then to the wafer.

24. A method according to claim 23, wherein said light providing step comprises directing light from a light source to light pipe means.

25. A method according to claim 23, wherein said light providing step comprises (i) projecting light from a light source to a lens array to divide the light into a plurality of light beams, and (ii) mixing the plurality of light beams.

26. A method according to claim 23, wherein said light projecting step comprises (i) projecting the arcuate light to a stop having an arcuate opening, and (ii) projecting an image of the arcuate opening to the mask.

27. An exposure method for manufacturing fine pattern devices, such as semiconductor chips and liquid crystal devices, by exposing a wafer to a pattern of a mask to thereby print the mask pattern on the wafer, said method comprising the steps of:
   providing light having a substantially uniform intensity distribution;

passing portions of the light through light pipe assemblies having light reception surfaces disposed close to one another and light emission surfaces disposed along a predetermined arc, each of the light pipe assemblies having a polygonal cross-sectional shape, to produce light having a substantially arcuate shape; and projecting the arcuate light to the pattern of the mask and then to the wafer.

28. A method according to claim 27, wherein said light providing step comprises directing light from a light source to light pipe means.

29. A method according to claim 27, wherein said light providing step comprises (i) projecting light from a light source to a lens array to divide the light into a plurality of light beams, and (ii) mixing the plurality of light beams.

30. A method according to claim 27, wherein said light projecting step comprises (i) projecting the arcuate light to a stop having an arcuate opening, and (ii) projecting an image of the arcuate opening to the mask.

* * * * *

UNITED STATES PATENT AND TRADEMARK OFFICE
CERTIFICATE OF CORRECTION

PATENT NO. : 5,218,660
DATED : June 8, 1993
INVENTOR(S) : Takashi Omata

It is certified that error appears in the above-indentified patent and that said Letters Patent is hereby corrected as shown below:

COLUMN 3

Line 61, "light" should read --light pipe--; and
    Line 68, "invention" should read --invention,--.

COLUMN 5

Line 42, "ha" should read --has--.

COLUMN 6

Line 6, "Thus" should read --Thus,--.

COLUMN 9

Line 46, "pie" should read --pipe--.

Signed and Sealed this

Fourteenth Day of June, 1994

Attest:

BRUCE LEHMAN

*Attesting Officer*     *Commissioner of Patents and Trademarks*